(12) United States Patent
Kulkarni et al.

(10) Patent No.: US 12,392,809 B2
(45) Date of Patent: Aug. 19, 2025

(54) ENERGY METERS AND ENERGY MONITORING SYSTEMS AND METHODS (71) Applicant: Georgia Tech Research Corporation, Atlanta, GA (US)

(72) Inventors: Shreyas B. Kulkarni, Atlanta, GA (US); Deepak M. Divan, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 124 days.

(21) Appl. No.: 18/041,852

(22) PCT Filed: Aug. 26, 2021

(86) PCT No.: PCT/US2021/047642
§ 371 (c)(1),
(2) Date: Feb. 16, 2023

(87) PCT Pub. No.: WO2022/046959
PCT Pub. Date: Mar. 3, 2022

(65) Prior Publication Data
US 2023/0314491 A1 Oct. 5, 2023

Related U.S. Application Data (60) Provisional application No. 63/070,350, filed on Aug. 26, 2020.

(51) Int. Cl.
G01R 22/06 (2006.01)
G01R 15/18 (2006.01)

(52) U.S. Cl.
CPC ......... *G01R 22/063* (2013.01); *G01R 15/181* (2013.01)

(58) Field of Classification Search
CPC .... G01R 22/063; G01R 15/181; G01R 22/06; G01R 19/2513
See application file for complete search history.

(56) References Cited

U.S. PATENT DOCUMENTS

| 4,635,055 A * | 1/1987 | Fernandes | G01R 15/142 374/E1.019 |
| 7,579,824 B2 * | 8/2009 | Rea | G01R 15/181 336/200 |

(Continued)

FOREIGN PATENT DOCUMENTS

| JP | 2001289885 A | 10/2001 |
| KR | 102063647 B1 | 1/2020 |
| WO | 2014/136589 A1 | 9/2014 |

OTHER PUBLICATIONS

What is a Rogowski Coil Current Probe?, Keysight Technologies, downloaded Aug. 21, 2024 from https://docs.keysight.com/kkbopen/what-is-a-rogowski-coil-current-probe-587212158.html (Year: 2024).*

(Continued)

*Primary Examiner* — Daniel R Miller
(74) *Attorney, Agent, or Firm* — Troutman Pepper Locke LLP; Ryan A. Schneider; Dustin B. Weeks (57) ABSTRACT An exemplary embodiment of the present disclosure provides an energy meter comprising a current sensor and an interchangeable voltage sensor. The current sensor can be configured to measure an electrical current flowing through a conductor. The interchangeable voltage sensor detachably can be connected to the current sensor and configured to measure an electrical voltage carried by the conductor.

21 Claims, 11 Drawing Sheets (56) References Cited

U.S. PATENT DOCUMENTS

| | | |
|---|---|---|
| 2005/0017751 A1 | 1/2005 | Gunn et al. |
| 2006/0012382 A1* | 1/2006 | Yakymyshyn ......... G01R 15/06 |
| | | 324/705 |
| 2007/0108986 A1* | 5/2007 | Moore ................. G01R 35/007 |
| | | 340/657 |
| 2009/0079416 A1 | 3/2009 | Vinden et al. |
| 2012/0062249 A1 | 3/2012 | Shamir |
| 2014/0145858 A1 | 5/2014 | Miller et al. |
| 2014/0203817 A1* | 7/2014 | Roberson .......... H02J 13/00002 |
| | | 324/539 |
| 2014/0207399 A1 | 7/2014 | Roberson |
| 2017/0074917 A1* | 3/2017 | Caous .................... G01R 31/58 |
| 2017/0356935 A1 | 12/2017 | Hurwitz |
| 2018/0263100 A1 | 9/2018 | Gebert |
| 2018/0321286 A1 | 11/2018 | Keister et al. |
| 2019/0346492 A1 | 11/2019 | Worones et al. |
| 2020/0072883 A1 | 3/2020 | Zurek |

OTHER PUBLICATIONS

C. Villani, S. Benatti, D. Brunelli and L. Benini, "A contactless three-phase autonomous power meter," 2016 IEEE Sensors, Orlando, FL, USA, 2016, pp. 1-3 (Year: 2016).*

International Search Report and Written Opinion from Application No. PCT/US2021/047642 dated Jan. 12, 2022.

Extended European Search Report from Application No. 21862691.9 dated Oct. 4, 2024.

* cited by examiner

ENERGY METERS AND ENERGY MONITORING SYSTEMS AND METHODS

CROSS-REFERENCE TO RELATED APPLICATIONS

This application claims the benefit of U.S. Provisional Application Ser. No. 63/070,350, filed on 26 Aug. 2020, which is incorporated herein by reference in its entirety as if fully set forth below.

FIELD OF THE DISCLOSURE

The various embodiments of the present disclosure relate generally to energy meters and energy monitoring systems and methods.

BACKGROUND

Buildings account for up to 40% of the total energy demand in USA resulting in annual bills over $410 Billion. The push for better energy efficiency and efficient use has driven the need for monitoring and ubiquitous sensing across buildings, industrial plants and commercial establishments. Typically, this has been achieved by sub-metering solutions that can measure and report time-stamped energy consumption information from various locations inside the building where the sensors are installed. The data reported to a central "cloud" system is used for load disaggregation, asset monitoring, and further analysis. The approach has been well-known, with several electric sub-metering solutions available, tailored for different service configurations—single phase/two-wire, single phase/three-wire, three phase/three wire, three phase/four wire. Widespread monitoring and the resulting data can help operators and building managers optimize the energy usage, unlocking potential savings and benefits.

Traditional solutions rely on energy meters or sub-meters to measure electric power at the circuit level, utilizing specialized transducers for converting voltages and currents into digital signals and extracting active, reactive and apparent power information. The transducers like current transformers (CTs) are customized for a particular service and power level, while the voltage modules may be configured for the type of service (three phase ($\varphi$) vs single phase connections). For instance, for covering a range from 1 Amp to 1000 Amps, three to four types of CTs would typically be required. If operated outside these ratings, the devices can be damaged or they can provide erroneous measurements.

Figure 1:
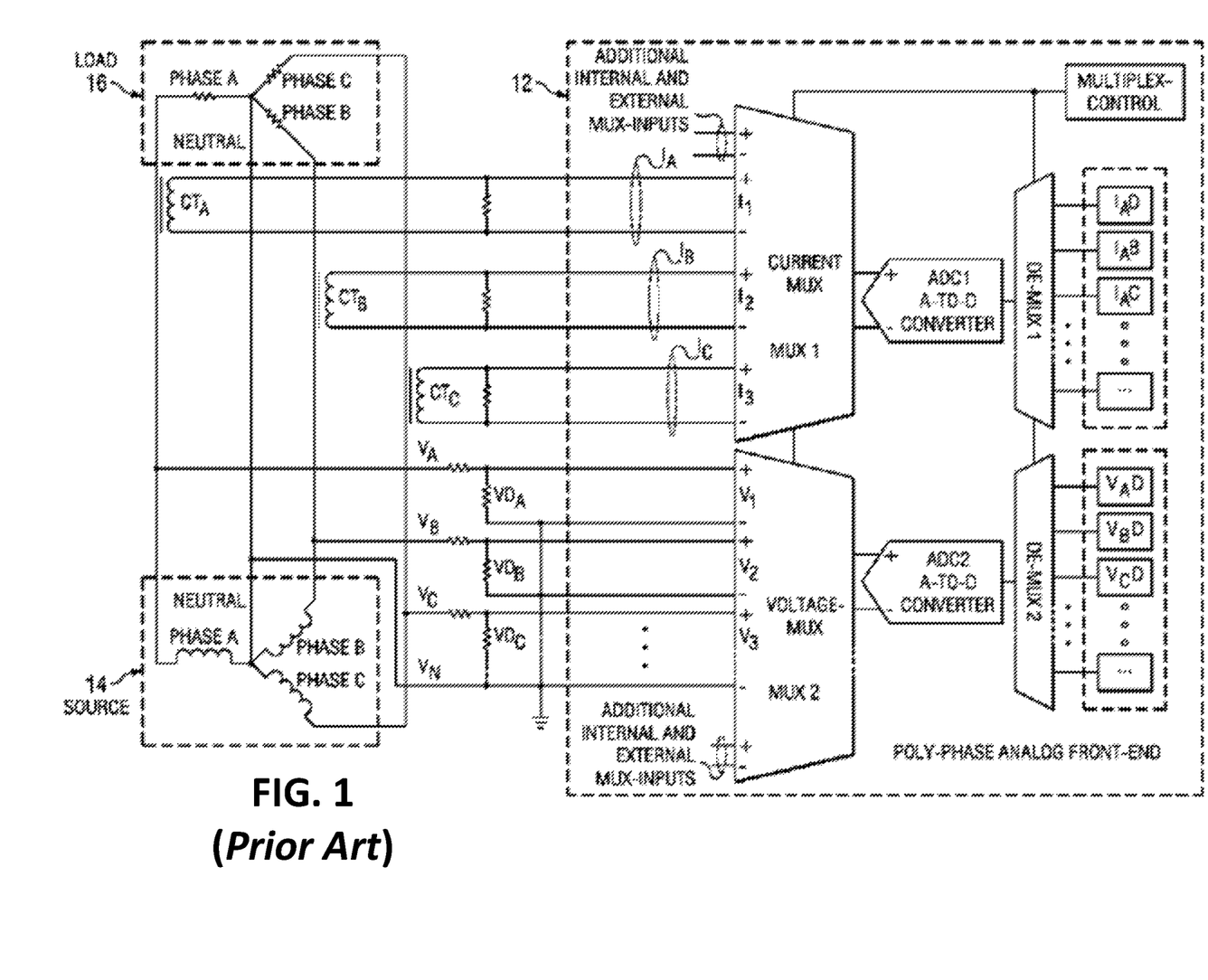
FIG. 1 provides a conventional poly-phase energy monitoring system.
Figure 2:
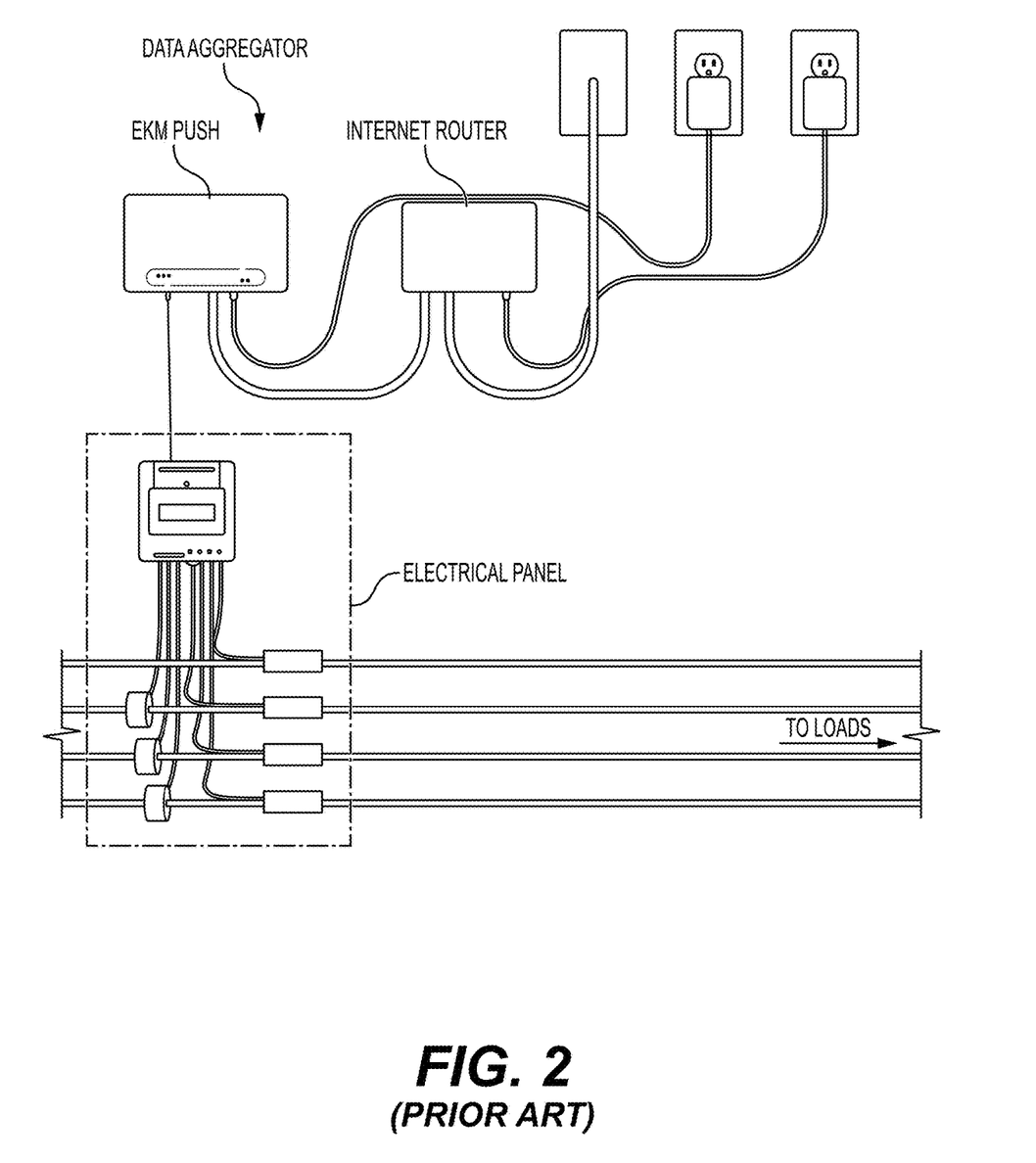
FIG. 2 illustrates various components of a conventional poly-phase energy monitoring system.

The different types of service connections (single, split-single, three-phase/three or four wire) has necessitated device manufacturers to develop sub-metering equipment in a variety of configurations, each catered towards the different type of connections available at the premise. The poly-phase metering solutions are typically expensive and require significant effort to configure and install in the field. For instance, for monitoring a three phase/four wire system, a three-phase meter typically would require three voltage connections and four current connections, each with two wire leads running from the transducer to the sub-metering unit. A conventional poly-phase metering solution is shown in FIG. 1, and the associated components are shown in FIG. 2. A central entity in the solution, typically an Analog Front End (AFE) or a micro-controller (MCU) with a digital signal processing (DSP) unit is responsible for digitizing current and voltage signals to subsequently compute power. This method is well known, and the advantage of the method is that it allows synchronized sampling (through an A/D converter) and computation of power or energy across all phases being monitored.

By way of example, assume the energy meter records a measurement every 1 min, generating energy measurements $\{E_n, E_{n+1}, E_{n+2} \ldots\}$ for each phase. However, within an energy meter, the measurements should be accurate to within tens of microseconds, if accuracy is to be realized. Even though each individual meter across a fleet of devices maintains its own time, it is likely to drift with respect to other meters, and with coordinated universal time, by a time interval that can be substantial and is often not tracked. However, for a given meter, due to the synchronized nature of the sampling across phases (through the central MCU/DSP), the $E_{n+k}$ for each phase corresponds to the same local time for a single unit, although this may be different from the global coordinated universal time. Thus, with the above approach, it becomes easier to maintain time synchronization and sampling across the three phases that a particular unit monitors. Typically, at a system level, one is more interested in average real power and reactive power flows and time synchronization is required only at the minute scale, which is relatively easy to realize.

Figure 3:
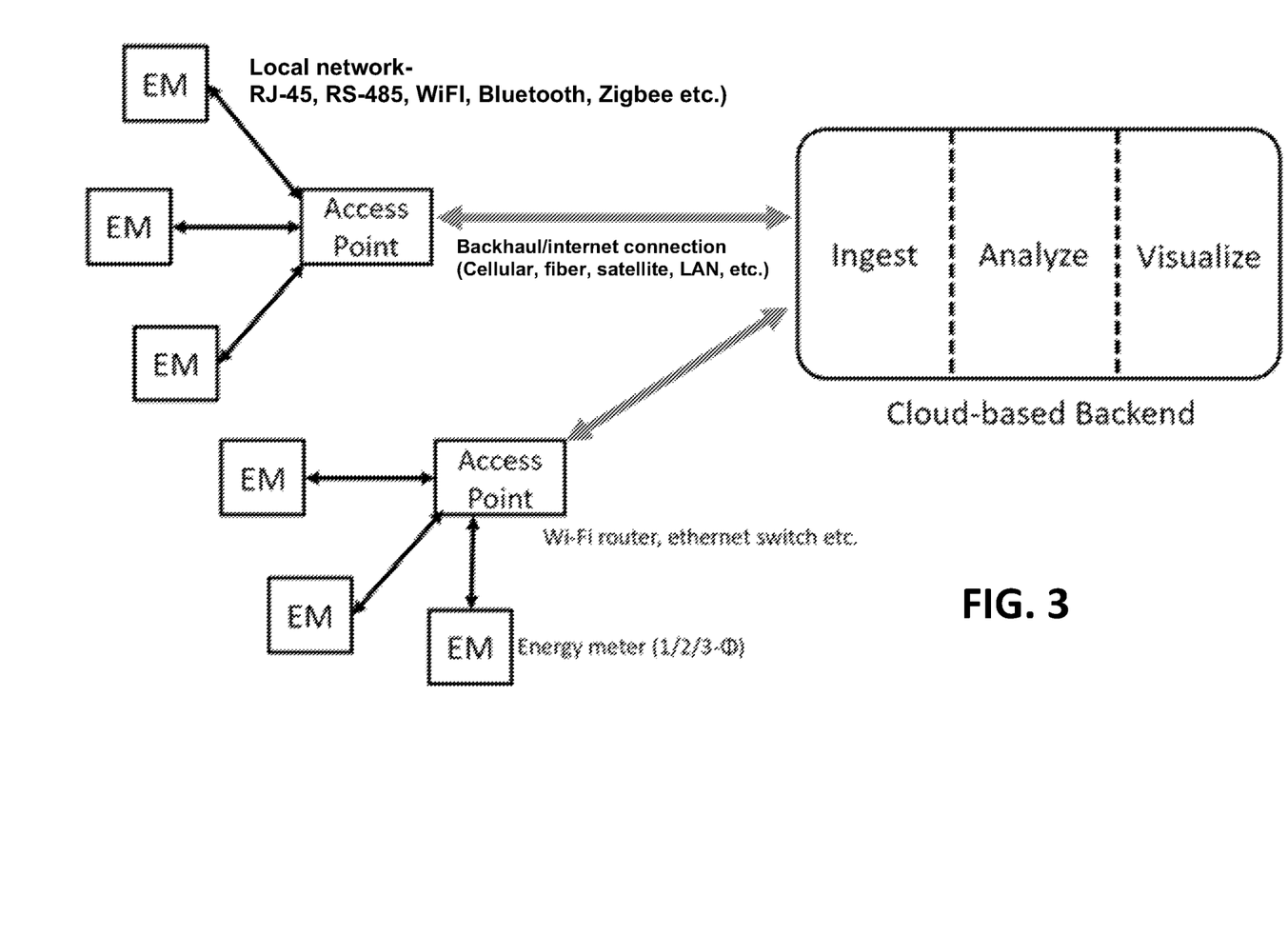
FIG. 3 provides a block diagram of a conventional system for monitoring multiple energy meters in a poly-phase energy monitoring system.

In order to report the measurements to the cloud, operators use standardized communication interfaces like a wired line (LAN, RJ-45, RS-485, fiber-optic etc.) or wireless radio (Wi-Fi, cellular, Bluetooth, Zigbee etc.). As part of the configuration process, after the sub-metering unit is installed in the field, it is connected with a modem or router through one of the interfaces mentioned above. A representation is shown in FIG. 3.

It is clear that the approach described above can quickly lead to a significantly customized and consequently challenged solution. It involves choosing the correct configuration of the sub-metering solution, choosing the appropriate transducers (particularly CTs), wiring and installing them at the concerned location, and, finally, configuring the device to report the measurements to a cloud-based server through an appropriate communication interface. Each of these steps can be time-consuming adding up to the overall cost involved in the installation and configuration of each device.

Accordingly, there is a need for improved energy meters and energy monitoring systems that address one or more of the issues described above.

BRIEF SUMMARY

The present disclosure relates to energy meters and energy monitoring systems. An exemplary embodiment of the present disclosure provides an energy meter comprising a current sensor and an interchangeable voltage sensor. The current sensor can be configured to measure an electrical current flowing through a conductor. The interchangeable voltage sensor can be detachably connected to the current sensor and configured to measure an electrical voltage carried by the conductor.

In any of the embodiments disclosed herein, the current sensor can be a clip-on Rogowski coil current sensor.

In any of the embodiments disclosed herein, the Rogowski coil current sensor can be embedded into a printed circuit board.

In any of the embodiments disclosed herein, the current sensor can be configured to measure electrical current over a range of 10 mA to 30 kA.

In any of the embodiments disclosed herein, the current sensor can be configured to measure electrical current over a range of 15 mA to 30 kA.

In any of the embodiments disclosed herein, the voltage sensor can be further configured to harvest electrical power from the conductor and provide electrical power to the current sensor.

In any of the embodiments disclosed herein, the current sensor can comprise a controller configured to record time-stamped data indicative of the measured current and voltage.

In any of the embodiments disclosed herein, the controller can be further configured to record time-stamped data indicative of a power at the conductor calculated based on the measured current and voltage.

In any of the embodiments disclosed herein, the energy meter can further comprise a wireless transceiver configured to transmit the recorded time-stamped data to a remote device.

In any of the embodiments disclosed herein, the controller can be configured to periodically record the time-stamped data.

In any of the embodiments disclosed herein, the interchangeable voltage sensor can be configured to measure one of 120 VAC, 208 VAC, 240 VAC, 480 VAC, or 600 VAC.

Another embodiment of the present disclosure provides an energy monitoring system for a polyphase electrical system comprising a plurality of conductors. The energy monitoring system can comprise a first energy meter and a second energy meter. The first energy meter can comprise a first clip-on Rogowski coil current sensor and a first interchangeable voltage sensor. The first clip-on Rogowski coil current sensor can be configured to measure an electrical current flowing through a first conductor of the plurality of conductors. The first interchangeable voltage sensor can be detachably connected to the first current sensor and configured to measure an electrical voltage carried by the first conductor. The second energy meter can comprise a second clip-on Rogowski coil current sensor and a second interchangeable voltage sensor. The second clip-on Rogowski coil current sensor can be configured to measure an electrical current flowing through a second conductor of the plurality of conductors. The second interchangeable voltage sensor can be detachably connected to the second current sensor and configured to measure an electrical voltage carried by the second conductor.

In any of the embodiments disclosed herein, the polyphase electrical system can be a 3-phase electrical system. The plurality of conductors can consist of the first conductor, the second conductor, and a third conductor. The energy monitoring system can be further configured to determine, based on the measured currents flowing through the first and second conductors and the measured voltages carried by the first and second conductors, an electrical current flowing through the third conductor and an electrical voltage carried by the third conductor.

In any of the embodiments disclosed herein, the polyphase electrical system can be a 3-phase electrical system. The plurality of conductors can consist of the first conductor, the second conductor, a third conductor, and a fourth conductor. The energy monitoring system can further comprise a third energy meter comprising a third clip-on Rogowski coil current sensor and a third interchangeable voltage sensor. The third clip-on Rogowski coil can be configured to measure an electrical current flowing through the third conductor. The third interchangeable voltage sensor can be detachably connected to the third current sensor and configured to measure an electrical voltage carried by the third conductor. The energy monitoring system can be further configured to determine, based on the measured currents flowing through the first, second, and third conductors and the measured voltages carried by the first, second, and third conductors, an electrical current flowing through the fourth conductor and an electrical voltage carried by the fourth conductor.

In any of the embodiments disclosed herein, the first conductor can be associated with a first phase of electrical power, and the second conductor can be associated with a second phase of electrical power.

In any of the embodiments disclosed herein, the first and second current sensors can be configured to measure electrical current over a range of 10 mA to 30 kA.

In any of the embodiments disclosed herein, the first and second current sensors can be configured to measure electrical current over a range of 15 mA to 30 kA.

In any of the embodiments disclosed herein, the first and second voltage sensors can be further configured to harvest electrical power from the first and second conductors, respectively, and provide electrical power to the first and second current sensors, respectively.

In any of the embodiments disclosed herein, the first and second interchangeable voltage sensors can be configured to measure one of 120 VAC, 208 VAC, 240 VAC, 480 VAC, or 600 VAC.

In any of the embodiments disclosed herein, each of the first and second current sensors can comprise a controller configured to record time-stamped data indicative of the measured current flowing through the first and second conductors, respectively, and voltage carried by the first and second conductors, respectively.

In any of the embodiments disclosed herein, each of the first and second energy meters can further comprise a wireless transceiver configured to transmit the recorded time-stamped data to a remote device.

In any of the embodiments disclosed herein, each of the controllers can be configured to periodically record the time-stamped data.

In any of the embodiments disclosed herein, the system can be further configured to time-synchronize the recorded time-stamped data.

In any of the embodiments disclosed herein, the system can be further configured to time-synchronize by recorded time-stamped data by: identifying corresponding points of interest in the time-stamped data recorded by the first energy meter and the second energy meter; and calculating, based on the identified corresponding points of interest, a time drift associated with the recorded data from the controllers of the first and second energy meters.

These and other aspects of the present disclosure are described in the Detailed Description below and the accompanying drawings. Other aspects and features of embodiments will become apparent to those of ordinary skill in the art upon reviewing the following description of specific, exemplary embodiments in concert with the drawings. While features of the present disclosure may be discussed relative to certain embodiments and figures, all embodiments of the present disclosure can include one or more of the features discussed herein. Further, while one or more embodiments may be discussed as having certain advantageous features, one or more of such features may also be used with the various embodiments discussed herein. In similar fashion, while exemplary embodiments may be discussed below as device, system, or method embodiments, it is to be understood that such exemplary embodiments can be implemented in various devices, systems, and methods of the present disclosure.

BRIEF DESCRIPTION OF THE DRAWINGS

The following detailed description of specific embodiments of the disclosure will be better understood when read in conjunction with the appended drawings. For the purpose of illustrating the disclosure, specific embodiments are shown in the drawings. It should be understood, however, that the disclosure is not limited to the precise arrangements and instrumentalities of the embodiments shown in the drawings.

FIGS. 6A-6E provide simulated waveforms obtained with an energy monitoring system for a 3-φ4-wire system.

FIGS. 7A-F provide simulated power and energy profiles for individual single-phase meters in a 3-φ4-wire system.

DETAILED DESCRIPTION

To facilitate an understanding of the principles and features of the present disclosure, various illustrative embodiments are explained below. The components, steps, and materials described hereinafter as making up various elements of the embodiments disclosed herein are intended to be illustrative and not restrictive. Many suitable components, steps, and materials that would perform the same or similar functions as the components, steps, and materials described herein are intended to be embraced within the scope of the disclosure. Such other components, steps, and materials not described herein can include, but are not limited to, similar components or steps that are developed after development of the embodiments disclosed herein.

Figure 4A:
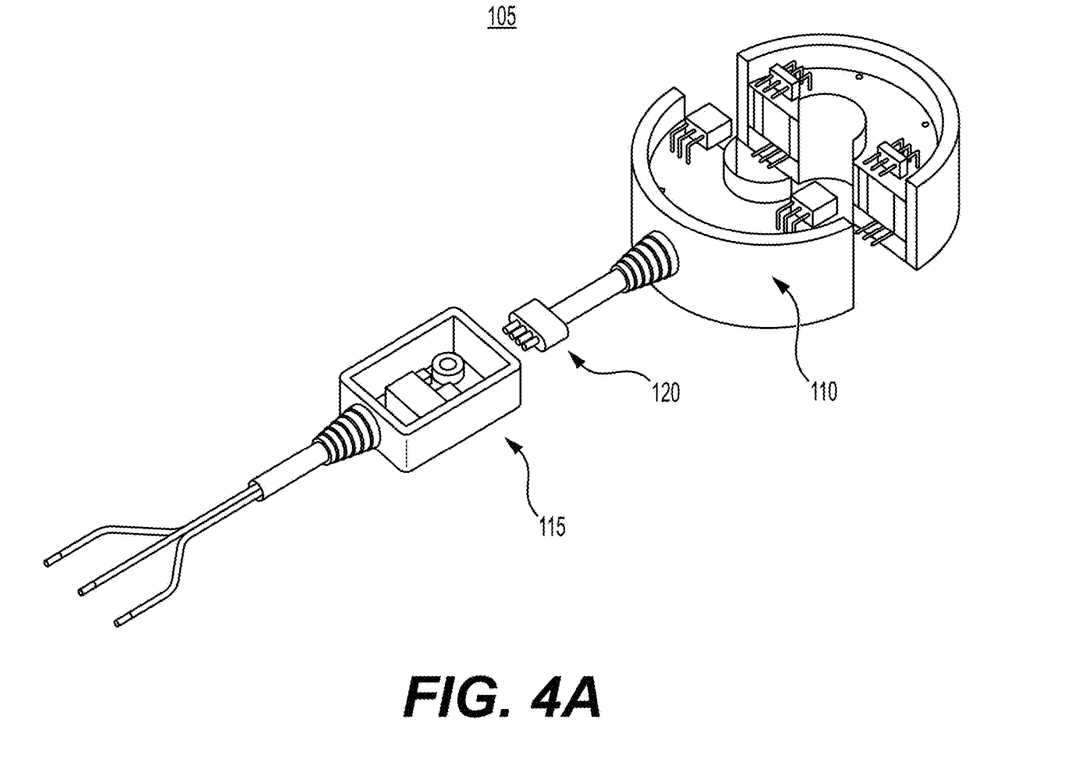
FIG. 4A provides an energy meter, in accordance with an exemplary embodiment of the present disclosure.
Figure 4B:
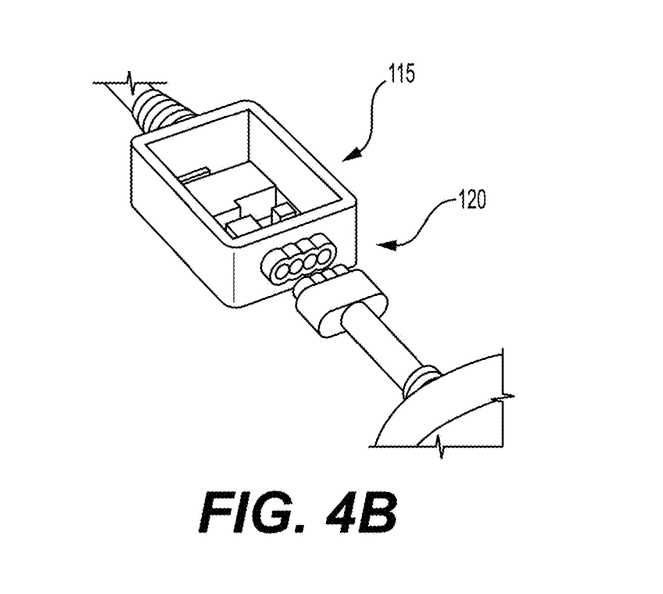
FIG. 4B provides an interchangeable voltage sensor, in accordance with an exemplary embodiment of the present disclosure.

The inventors have been developing an autonomous, distributed grid-edge monitoring and control platform called GAMMA, which enables the fleet management of low-cost sensing solutions. Described herein is a sensor that can be supported by GAMMA platform that is a modular, universal single-phase energy metering device, as pictured in FIGS. 4A-B. The energy metering device 105 can be used to measure electrical parameters associated with a conductor carrying an electrical current (e.g., current, voltage, and power). As shown in FIGS. 4A-4B, the energy meter 105 can comprise a clip-on current sensor 110 with an energy metering interface and an interchangeable voltage module 115. The current sensor 110 can be configured to measure an electrical current flowing through the conductor. The interchangeable voltage sensor 115 can be detachably connected to the current sensor 110 and configured to measure an electrical voltage carried by the conductor.

The current sensor 110 can be a clip-on current sensor such that the energy meter 105 can be installed on the conductor in a minimally invasive manner. In some embodiments, the clip-on current sensor 110 can be configured as a Rogowski coil current sensor, such as those current sensors previously disclosed by the inventors in International Patent Application No. PCT/US2020/044007, entitled "Current Sensors Employing Rogowski Coils and Methods of Using Same," which is incorporated herein by reference in its entirety as if fully set forth below. These Rogowski coil current sensors can be operated across a wide range of operating current levels. For example, with a novel, adaptive signal conditioning stage, the current sensor can adjust and adapt the operating characteristics. This can allow the current sensor 110 to accurately measure current values over a range of 10 mA to over 30 kA. With the modularity of the energy meter 105, the need for configuring the solution to different service levels is minimized. With the choice of the appropriate voltage module 115, the device can be operated identically across different service levels.

Accordingly, the voltage sensor 110 can be an interchangeable voltage sensor detachably connected to the current sensor 110. As used herein, the term "interchangeable" is used to describe the installer of the energy meter can select a voltage sensor configured to an appropriate voltage sensing level, e.g., 120 VAC, 208 VAC, 240 VAC, 480 VAC, or 600 VAC, based on the particular configuration. The interchangeability/detachability of the voltage sensor can be provided via a common adapter 120 used to connect the voltage sensor 115 to the current sensor 110. Thus, if the energy meter 105 is to be placed on an electrical conductor carrying a nominal voltage level of 240 VAC, an interchangeable voltage sensor configured to measure a 240 VAC voltage level, which as a person of ordinary skill in the art would understand would include voltage levels typically experienced by such a conductor, could be selected for that application and connected to the current sensor 110.

The energy meter 105 shown in FIGS. 4A-4B can be used for energy metering and sub-metering, both for single point single or three phase measurement, or for monitoring a fleet of such sensors located in a plant or anywhere across the globe. It simplifies the hardware into a current sensor 110 which can measure with the needed accuracy over a wide range of current levels. The current sensor 110 is connected using a wire/connector 120 to the voltage sensor 115, which receives the voltage to be measured (including no voltage in case it is pure current sensor) and conditions it to both provide the voltage being sensed, as well as small amount of power using energy harvesting (either from the environment or from the voltage being measured).

The energy meter 105 described above can perform energy sub-metering, e.g., recording pre-determined electrical quantities (like voltage, current, power, energy, power factor etc.) in a time-stamped manner. The energy meter 105 can further comprise a transceiver device (not shown) that can be used to securely uplink the said electrical quantities to a cloud database. The transceiver can be any transceiver known in the art, wired or wireless. With a software backend, such as the GAMMA platform, the energy meter 105 can be remotely configured making it low-cost and easy to install and operate. GAMMA would also allow the current sensor 110 to be installed anywhere in the world, using "data mules" to hop the data to the cloud.

Figure 5A:
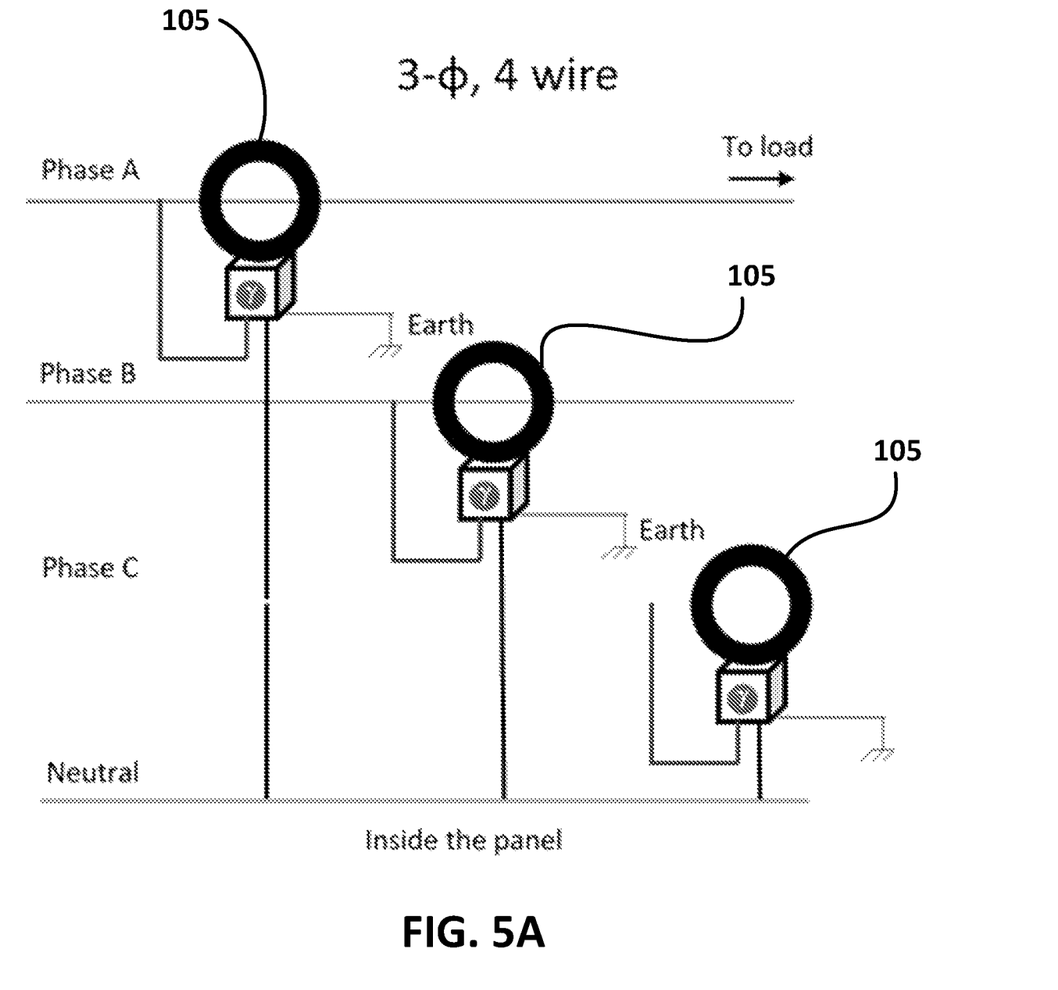
FIG. 5A illustrates a 3-φ4-wire system employing three energy meters, in accordance with an exemplary embodiment of the present disclosure.
Figure 5B:
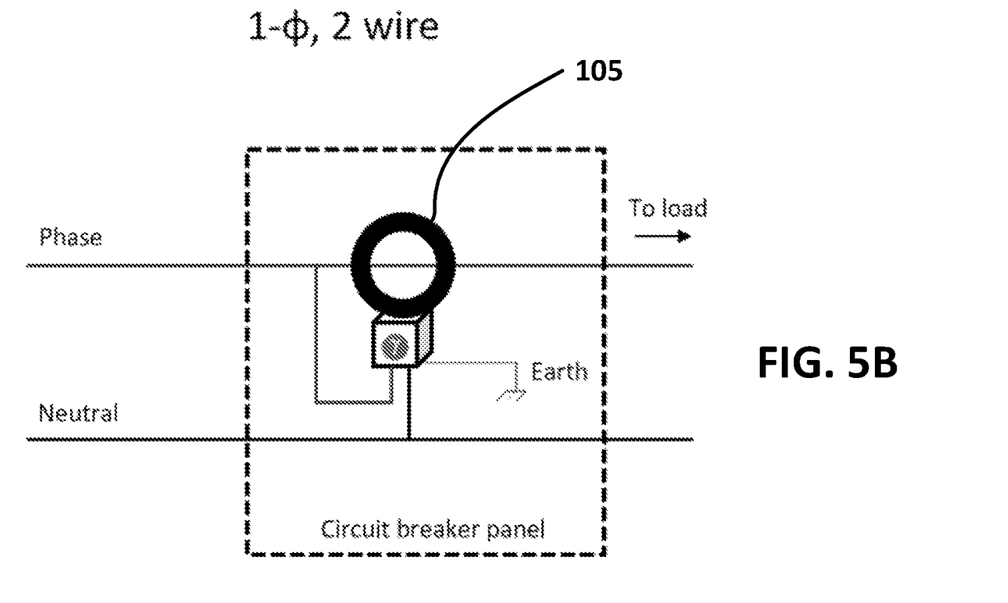
FIG. 5B illustrates a 1-φ2-wire system employing one energy meter, in accordance with an exemplary embodiment of the present disclosure.
Figure 5C:
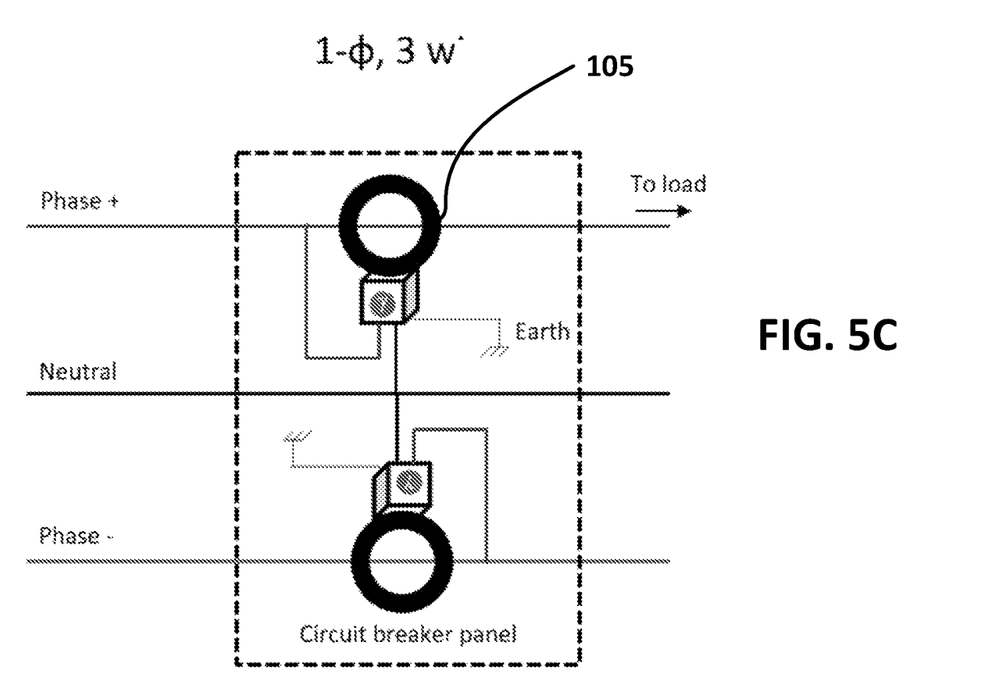
FIG. 5C illustrates a 1-φ3-wire system employing two energy meters, in accordance with an exemplary embodiment of the present disclosure.
Figure 6A:
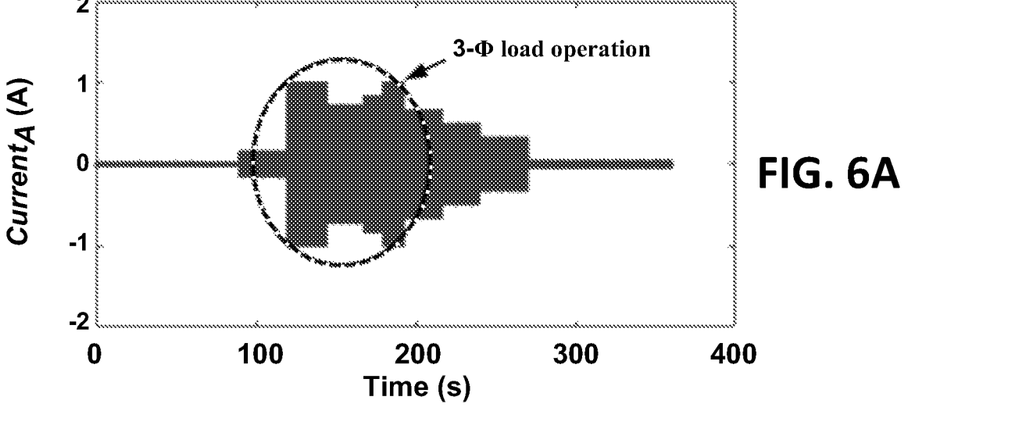
FIG. 6A provides current measurements for phase A.
Figure 6B:
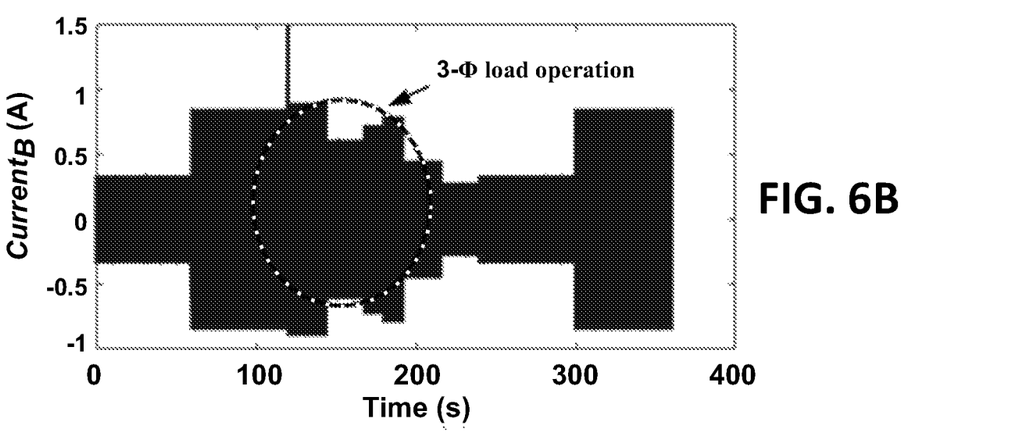
FIG. 6B provides current measurements for phase B.
Figure 6C:
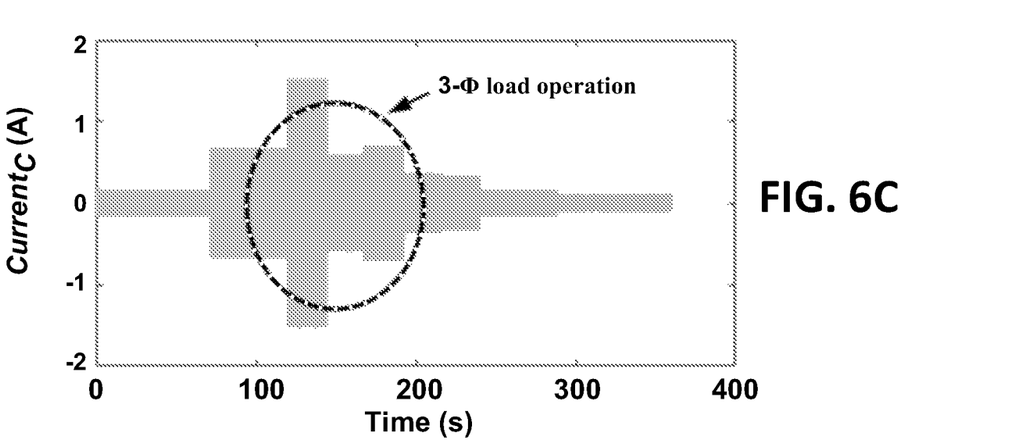
FIG. 6C provides current measurements for phase C.
Figure 6D:
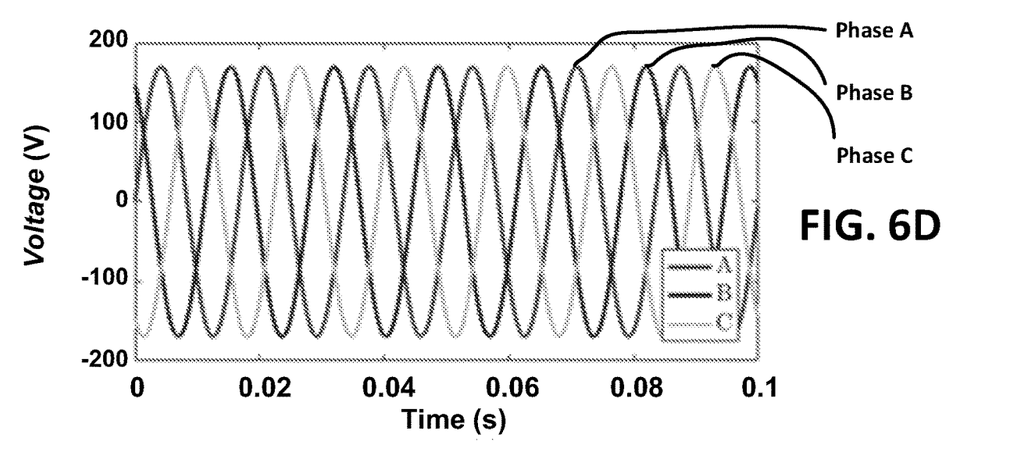
FIG. 6D provides voltages measurements for phases A, B, and C.
Figure 6E:
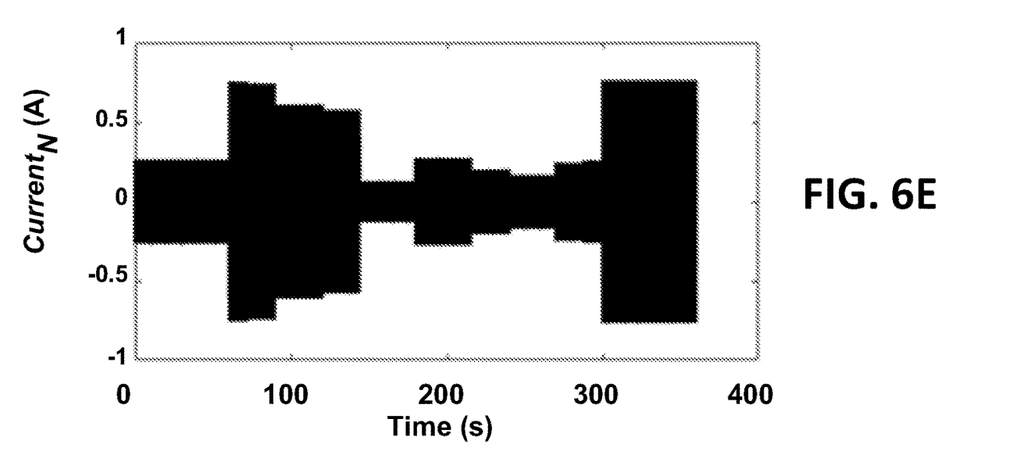
FIG. 6E provides neutral current 3-φ4-wire system.

A major benefit of the energy meters 105 disclosed herein is with poly-phase monitoring, requiring multiple voltage and current sensors. In conventional monitoring systems, one needs to connect all voltage and current measurements into a common processor, so that synchronous samples of voltage and current can be used to measure the power and energy. This requires the routing and interconnection of all the wires in the field in a mechanically secure and safe manner, needing skilled labor for installation and commissioning. With the poly-phase monitoring system disclosed herein, multiple energy meters are simply located at appropriate points that would provide voltage/current/power/energy measurements at single points. For instance, these configurations could be 1-φ/two-wire, 1-φ/three-wire, 3-φ/three wire, 3-φ/four wire, multiple identically configured devices can be utilized for independently monitoring each of the phases and multiple identically configured devices can be utilized for independently monitoring each of the phases. Typically, to monitor the energy/power in system that has N phases, K wires, a minimum of (K−1) energy meters are employed. FIGS. 5A-5C show various configurations. Specifically, FIG. 5A shows a 3-φ4-wire system employing three energy meters 105. FIG. 5B shows a 1-φ2-wire system employing one energy meter 105. FIG. 5C shows a 1-φ3-wire system employing two energy meters 105.

With the proposed energy meter 105 being easy to install and configure, it is envisioned that the total effort and cost involved in installing and configuring three of the disclosed meters 105 would be lesser than installing and configuring a single 3-φ sensor using the traditional approach. The data from all the energy meters 105 can be uploaded to the cloud and post-processed in software to obtain all individual point measurements. This is achieved for as many points as one would like to monitor in a plant or feeder. The proposed approach completely eliminates complex installation and commissioning, and minimizes the need for skilled labor in the field thus reducing cost and complexity.

However, as discussed above, when three individual energy meters 105 are used for monitoring poly-phase systems it can be difficult to synchronize the time instances when the energy/power measurements are made on each meter. Moreover, each meter 105 can have small drifts in the real-time clocks which can accumulate over larger intervals and cause erroneous measurements when aggregated together in the cloud database. To overcome this, a method to correct for the timing de-synchronization is disclosed herein. The method can periodically look at the data reported to the cloud, to ascertain similarities in the power/energy profiles in the three phases. These similarities are herein referred to as "points of interest," which are similar increases/decreases in the measured parameter (e.g., voltage, current, or power) across multiple phases, but in which the points where the increase/decrease occur are offset by different periods of time (corresponding to the time drift). In three phase systems, both balanced and unbalanced, a change in three phase load operation reflects in the change in currents flowing through the individual phases. Larger, more prominent changes in loads (such as an induction motor start/stop, or a HVAC unit operation) can result in larger fluctuations in the currents flowing through phases A, B and C. These changes can reflect in the recorded voltage and energy (and consequently power) profiles and can be periodically used to correct for the time drifts on individual energy meters.

As an illustration, consider a 3-φ system with voltages as shown in FIGS. 6A-E, connected in a 3-φ/4-wire configuration. The system has a 3-φ load being operated from t=120 to t=240 sec, with the remaining system having small, unbalanced loads, resulting in a neutral current.

Figure 7A:
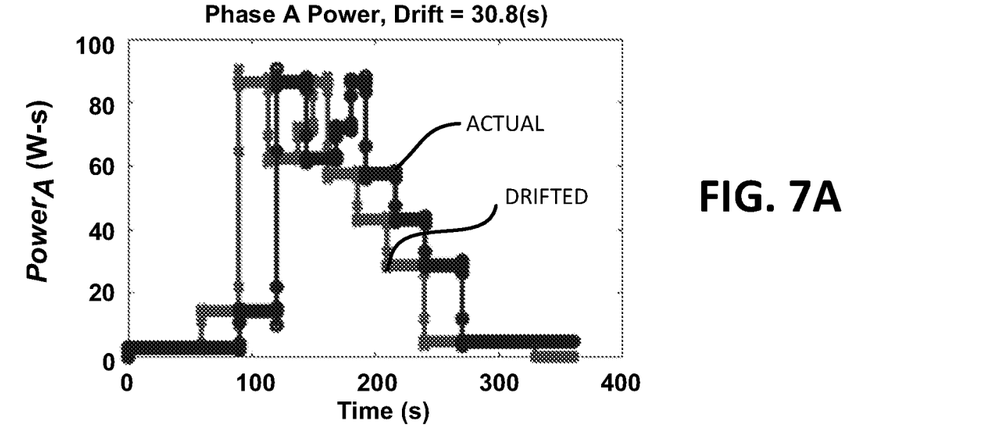
FIG. 7A provides a plot of the drifted profile v. the actual profile for power on phase A.
Figure 7B:
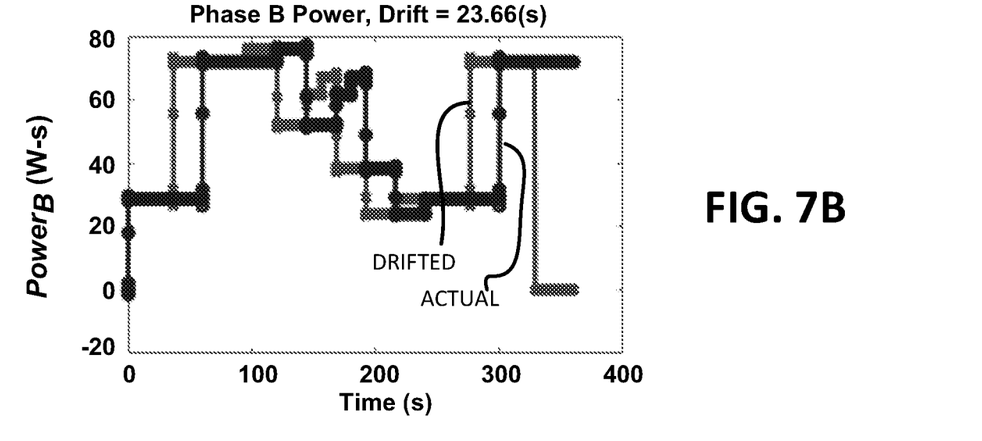
FIG. 7B provides a plot of the drifted profile v. the actual profile for power on phase B.
Figure 7C:
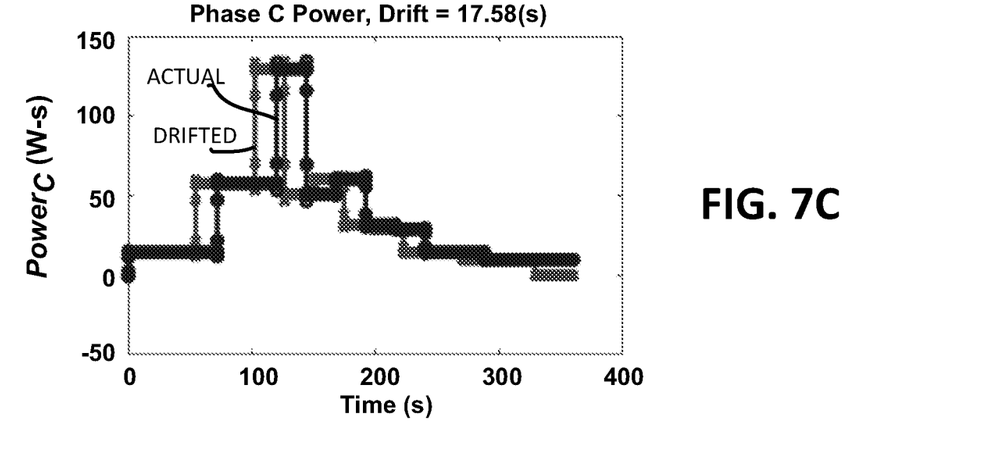
FIG. 7C provides a plot of the drifted profile v. the actual profile for power on phase C.
Figure 7D:
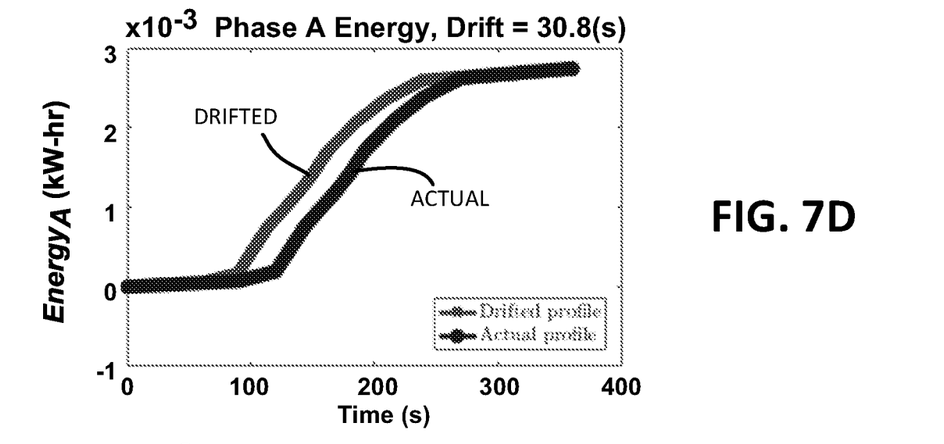
FIG. 7D provides a plot of the drifted profile v. the actual profile for energy on phase A.
Figure 7E:
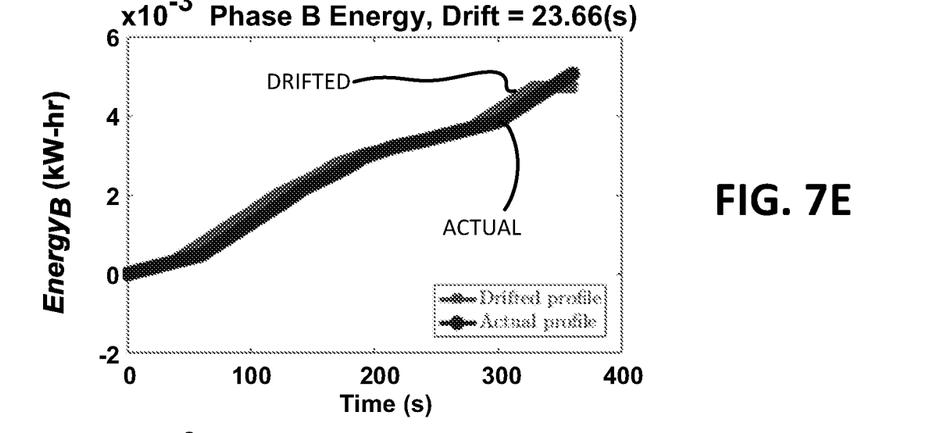
FIG. 7E provides a plot of the drifted profile v. the actual profile for energy on phase B.
Figure 7F:
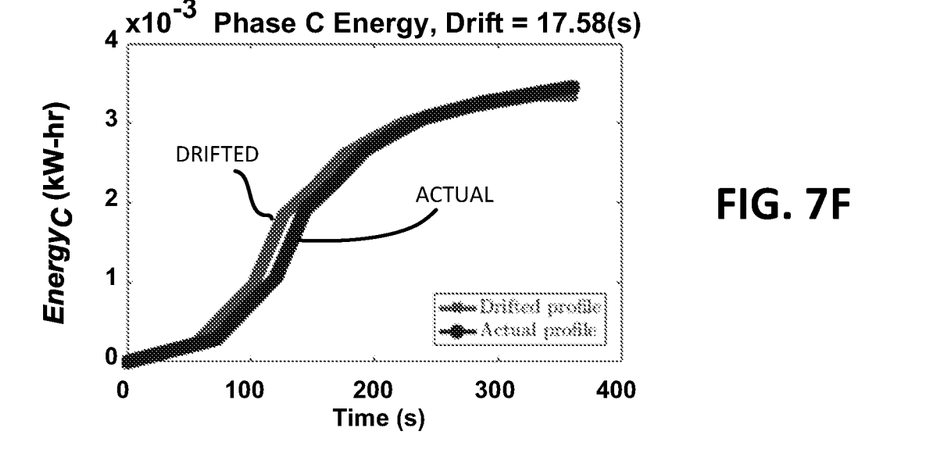
FIG. 7F provides a plot of the drifted profile v. the actual profile for energy on phase C.

Consider three individual single phase energy meters connected from each phase to neutral and measuring each line current for performing single phase energy metering, as shown in FIG. 5A. Assume each meter has a time drift relative to each other meter. For instance, as seen in FIGS. 7A-C, the meter on phase A has an overall drift of 30.8 sec (FIG. 7A), meter on phase B has a drift of 23.66 sec (FIG. 7B), and phase C has a drift of 17.58 sec (FIG. 7C). This results in a time deviation in the recorded energy profile (as compared to the actual one) that gets reported to the cloud, as shown in FIGS. 7D-F.

Figure 8:
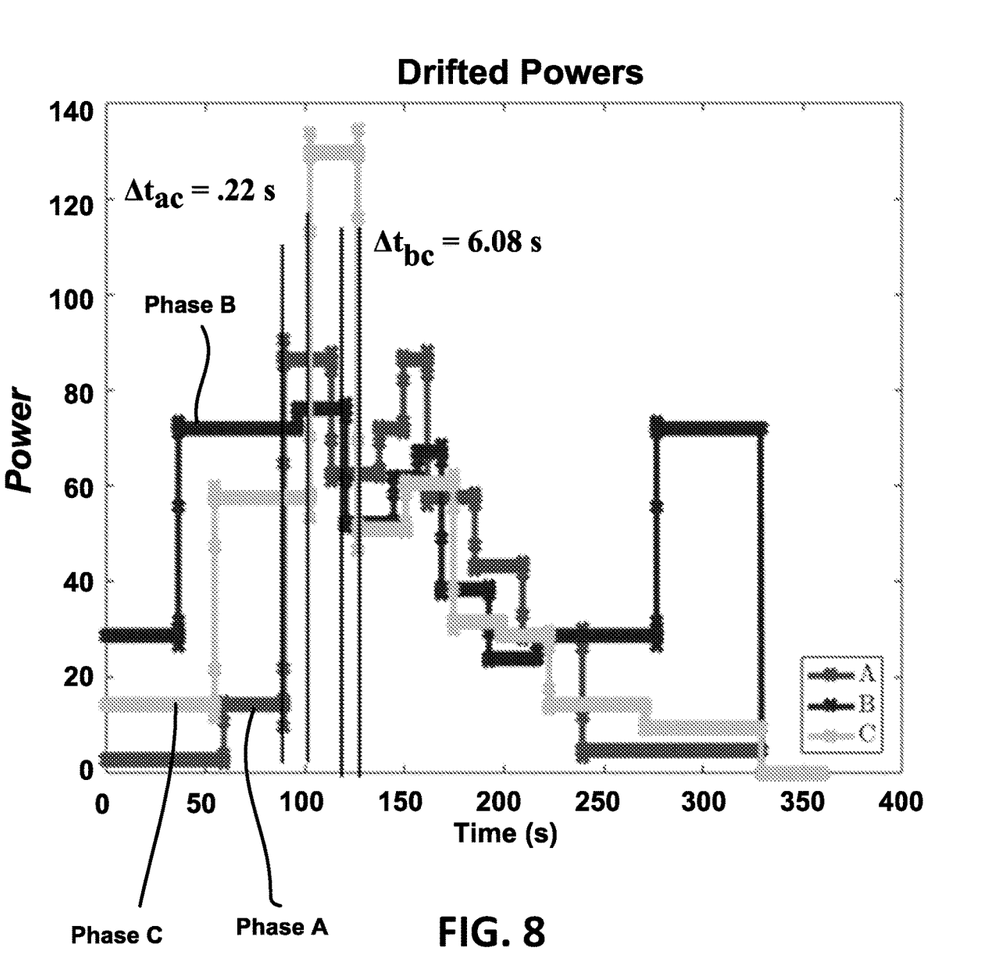
FIG. 8 provides simulated power profiles reported to a cloud-based remote device with drifts in individual single-phase energy meters.

Once reported to the cloud, with simple computation, the individual power profiles can be extracted. With co-relation, a large change in power profile can be used to extract the relative timing drift that has resulting in the shifted profiles, in the case illustrated $-\Delta t_{ac}=30.8-23.66=13.22$ sec which can be observed from FIG. 8 as well. Similar to large power variations, power quality disturbances recorded by individual meters can also be used to co-relate and correct for the drifts across different meters at the same installed location.

Indeed, the correction for the time drifts, i.e., time-synchronization of the measured parameters, can be achieved by identifying corresponding points of interest in the measured values by the multiple energy meters. In other words, the time-synchronization software can look for similar patterns in the measured values, for example where each measured parameter has a similar significant change (e.g., voltage drop). These "corresponding points of interest" in the measured data, which, in reality, occur at similar times, can be used to determine an actual time drift for each meter.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way.

What is claimed is:

1. An energy meter comprising:
a current sensor configured to measure an electrical current flowing through a conductor, the current sensor having a single adapter port;
a common adapter physically extending contiguously between a first end and a second end, the first end configured to connect to the current sensor at the single adapter port; and
a selected interchangeable voltage sensor physically extending contiguously between a first end and a second end, the first end configured to detachably connect to the second end of the common adapter and configured to measure an electrical voltage carried by the conductor;
wherein the common adapter is configured to connect to different interchangeable voltage sensors having different voltage sensing levels, the selected interchangeable voltage sensor being one from among the different interchangeable voltage sensors; and
wherein the energy meter is modular and configurable via selection of the selected interchangeable voltage sensor.

2. The energy meter of claim 1 further comprising:
a controller configured to record time-stamped data indicative of the measured current flowing through the conductor and the measured voltage carried by the conductor; and
a wireless transceiver configured to receive recorded time-stamped data from at least one different energy meter;
wherein:
the controller is further configured to time-synchronize by recorded time-stamped data by:
identifying corresponding points of interest in the recorded time-stamped data and in received time-stamped data recorded by at least one of the at least one different energy meter; and
calculating, based on the identified corresponding points of interest, a time drift associated with the energy meter and at least one of the at least one different energy meter; and
the current sensor is a clip-on Rogowski coil current sensor.

3. The energy meter of claim 2, wherein the Rogowski coil current sensor is embedded into a printed circuit board.

4. The energy meter of claim 2, wherein the conductor is a conductor of a polyphase electrical system; and
wherein the current sensor is configured to measure electrical current over a range of 10 mA to 30 kA.

5. The energy meter of claim 4, wherein the selected interchangeable voltage sensor is further configured to harvest electrical power:
from the conductor; and
provide electrical power to the current sensor.

6. The energy meter of claim 2, wherein the current sensor comprises the controller.

7. The energy meter of claim 2, wherein the controller is further configured to record time-stamped data indicative of a power at the conductor calculated based on the measured current and voltage.

8. The energy meter of claim 2, wherein the wireless transceiver is further configured to transmit the recorded time-stamped data to a remote device.

9. The energy meter of claim 2, wherein the controller is configured to periodically record the time-stamped data.

10. The energy meter of claim 2, wherein the selected interchangeable voltage sensor is configured to measure one of 120 VAC, 208 VAC, 240 VAC, 480 VAC, or 600 VAC.

11. An energy monitoring system that can measure phased power without relying on synchronous sampling comprising:
a first energy meter comprising:
a first current sensor configured to measure an electrical current flowing through a first conductor of a polyphase electrical system;
a first common adapter connected to the first current sensor;
a first selected interchangeable voltage sensor detachably connected to the first common adapter and configured to measure an electrical voltage carried by the first conductor; and
a first controller configured to record time-stamped data indicative of measured current and voltage; and
a second energy meter comprising:
a second current sensor configured to measure an electrical current flowing through a second conductor of the polyphase electrical system;
a second common adapter connected to the second current sensor;
a second selected interchangeable voltage sensor detachably connected to the second common adapter and configured to measure an electrical voltage carried by the second conductor;
a second controller configured to record time-stamped data indicative of measured current and voltage;
wherein the energy meters are located at the same location; and
wherein the first and second controllers are further configured to time-synchronize by recorded time-stamped data by:
identifying corresponding points of interest in the time-stamped data recorded by the first and second controllers; and
calculating, based on the identified corresponding points of interest, a time drift associated with the recorded data from the first and second controllers.

12. The energy monitoring system of claim 11, wherein the polyphase electrical system is a 3-phase electrical system; and
wherein each respective controller is further configured to determine, based on the measured currents flowing through the first and second conductors and the measured voltages carried by the first and second conductors, an electrical current flowing through a third conductor of the polyphase electrical system and an electrical voltage carried by the third conductor.

13. The energy monitoring system of claim 11 further comprising:
a third energy meter comprising:
a third current sensor configured to measure an electrical current flowing through a third conductor of the polyphase electrical system;
a third common adapter connected to the third current sensor;
a third selected interchangeable voltage sensor detachably connected to the third common adapter and configured to measure an electrical voltage carried by the third conductor; and
a third controller configured to record time-stamped data indicative of measured current and voltage;

wherein the polyphase electrical system is a 3-phase electrical system; and wherein each respective controller is further configured to determine, based on the measured currents flowing through the first, second, and third conductors and the measured voltages carried by the first, second, and third conductors, an electrical current flowing through a fourth conductor of the polyphase electrical system and an electrical voltage carried by the fourth conductor.

14. The energy monitoring system of claim 11, wherein each of the first and second current sensors is a clip-on Rogowski coil current sensor;

wherein the first conductor is associated with a first phase of electrical power; and wherein the second conductor is associated with a second phase of electrical power.

15. The energy monitoring system of claim 11, wherein each of the first and second current sensors is a clip-on Rogowski coil current sensor configured to measure electrical current over a range of 10 mA to 30 kA.

16. The energy monitoring system of claim 11, wherein the first and second selected interchangeable voltage sensors are configured to measure one of 120 VAC, 208 VAC, 240 VAC, 480 VAC, or 600 VAC.

17. The energy monitoring system of claim 11, wherein each of the common adapters is configured to connect to different interchangeable voltage sensors having different voltage sensing levels, the first and second selected interchangeable voltage sensors being two from among the different interchangeable voltage sensors.

18. The energy monitoring system of claim 11, wherein each of the first and second energy meters further comprises a wireless transceiver configured to transmit the recorded time-stamped data to a remote device.

19. The energy monitoring system of claim 11, wherein each of the controllers is configured to periodically record the time-stamped data.

20. The energy monitoring system of claim 11, wherein the first and second interchangeable voltage sensors are further configured to harvest electrical power:

from the first and second conductors, respectively; and provide electrical power to the first and second current sensors, respectively.

21. An energy meter comprising:

a current sensor configured to measure an electrical current flowing through a conductor;

a common adapter connected to the current sensor;

a selected interchangeable voltage sensor detachably connected to the common adapter and configured to measure an electrical voltage carried by the conductor;

a controller configured to record time-stamped data indicative of the measured electrical current flowing through the conductor and the measured electrical voltage carried by the conductor; and a wireless transceiver configured to receive recorded time-stamped data from at least one different energy meter;

wherein:

the common adapter is configured to connect to different interchangeable voltage sensors having different voltage sensing levels, the selected interchangeable voltage sensor being one from among the different interchangeable voltage sensors;

the energy meter is modular and configurable via selection of the selected interchangeable voltage sensor; and the controller is further configured to time-synchronize by recorded time-stamped data by:

identifying corresponding points of interest in the recorded time-stamped data and in received time-stamped data recorded by at least one of the at least one different energy meter; and calculating, based on the identified corresponding points of interest, a time drift associated with the energy meter and at least one of the at least one different energy meter.

* * * * *